(12) United States Patent
Lee

(10) Patent No.: US 7,635,607 B2
(45) Date of Patent: Dec. 22, 2009

(54) IMAGE SENSOR AND MANUFACTURING METHOD THEREOF

(75) Inventor: Min Hyung Lee, Cheongju-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 98 days.

(21) Appl. No.: 11/855,624

(22) Filed: Sep. 14, 2007

(65) Prior Publication Data
US 2008/0150052 A1 Jun. 26, 2008

(30) Foreign Application Priority Data
Dec. 20, 2006 (KR) .................. 10-2006-0131293

(51) Int. Cl.
*H01L 21/00* (2006.01)
(52) U.S. Cl. .................. 438/70; 257/414; 257/432
(58) Field of Classification Search ............... 257/414, 257/432; 438/70
See application file for complete search history.

(56) References Cited

U.S. PATENT DOCUMENTS

| | | | | |
|---|---|---|---|---|
| 6,329,275 B1 * | 12/2001 | Ishigami et al. | ............. | 438/584 |
| 6,379,992 B2 * | 4/2002 | Jo | ............. | 438/70 |
| 2005/0012166 A1 * | 1/2005 | Choi | ............. | 257/414 |
| 2007/0063299 A1 * | 3/2007 | Hwang | ............. | 257/432 |

FOREIGN PATENT DOCUMENTS

KR  10-2004-0115935  7/2006

* cited by examiner

*Primary Examiner*—Victor A Mandala
*Assistant Examiner*—William Harriston
(74) *Attorney, Agent, or Firm*—Saliwanchik, Lloyd & Saliwanchik

(57) ABSTRACT

An image sensor and fabricating method thereof are provided. A multi-layered interlayer insulating layer is formed on a substrate including a photodiode, and a metal line is formed in the interlayer insulating layer, such that the metal line passes through the interlayer insulating layer. A conductive barrier layer is formed on the metal line, a color filter array is formed on the interlayer insulating layer and the metal line, and microlenses are formed on the color filter array.

6 Claims, 5 Drawing Sheets

IMAGE SENSOR AND MANUFACTURING METHOD THEREOF

CROSS-REFERENCE TO RELATED APPLICATION

The present application claims the benefit under 35 U.S.C. §119 of Korean Patent Application No. 10-2005-0131293, filed Dec. 20, 2006, which is hereby incorporated by reference in its entirety.

BACKGROUND

A CMOS (complementary metal oxide semiconductor) image sensor is a device that can detect outputs of pixels in a switching manner. In a CMOS image sensor, MOS transistors formed in each unit pixel are manufactured using CMOS technology. A control circuit and a signal processing circuit are used as peripheral circuits, and the outputs of the pixels are sequentially detected using the MOS transistors.

As the number of pixels of a CMOS image sensor increases, the size of the pixels decrease.

Reduction in the size of the pixel limits the size of a microlens that can be disposed on the pixel, and thus shortens the focal length of the microlens. Therefore, the size of a metal line layer forming a logic circuit around the pixel is limited.

As the number of pixels of an image sensor increases, a micro-wiring process becomes necessary to increase the size of a pixel region.

BRIEF SUMMARY

Embodiments of the present invention provide an image sensor and a manufacturing method thereof that selectively deposits a copper barrier metal on a copper metal line as a conductive insulating layer to increase light transmittance.

Embodiments of the present invention also provide a method for manufacturing an image sensor that deposits a copper bump directly on a copper pad.

In one embodiment, a method for manufacturing an image sensor includes forming a multi-layered interlayer insulating layer on a substrate including a photodiode and forming a metal line in the interlayer insulating layer, such that the metal line passes through the interlayer insulating layer. A conductive barrier layer is also formed on the metal line, and a color filter array is formed on the interlayer insulating layer and the metal line. Additionally, microlenses are formed on the color filter array.

In another embodiment, an image sensor includes a substrate including a photodiode, an interlayer insulating layer on the substrate, and a metal line in the interlayer insulating layer. A conductive barrier layer is present on the metal line, and a color filter array and microlenses are on the interlayer insulating layer.

In a further embodiment, a method for manufacturing an image sensor includes: forming a plurality of interlayer insulating layers on a substrate including a photodiode; forming a metal line in the interlayer insulating layer; forming a color filter layer and microlenses on the interlayer insulating layer and the metal line; selectively etching the interlayer insulating layer to form a pad opening where a bump is to be formed; and depositing copper in the pad opening to form a copper bump.

The details of one or more embodiments are set forth in the accompanying drawings and the detailed description. Other features will be apparent to those skilled in the art from the detailed description, the drawings, and the appended claims.

DETAILED DESCRIPTION

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 1:
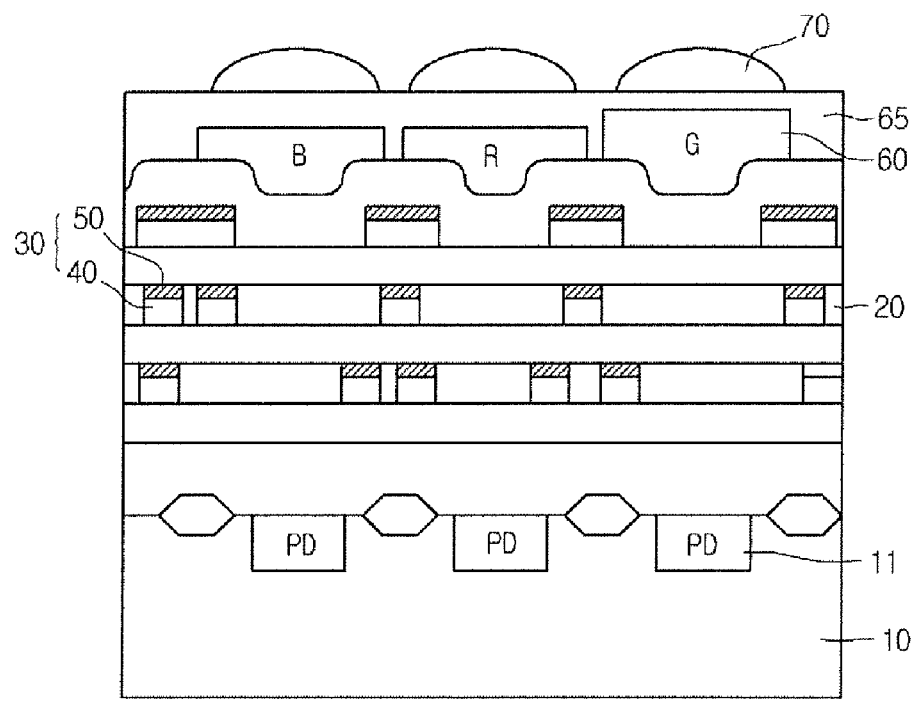
FIG. 1 is a cross-sectional view of an image sensor according to an embodiment of the present invention.

Referring to FIG. 1, a color filter array (CFA) 60, including blue, red, and green color filters for unit pixels, can be formed on a substrate 10 including a photodiode 11.

An over-coating layer 65 can be formed on the color filter array 60. Microlenses 70 having a convex shape can be formed on regions above the color filters 60.

Though not shown, a passivation layer for protecting the microlenses 70 can be formed on the microlenses 70.

Multi-layered metal lines 30 using copper can be formed between a light-receiving region including the photodiode 11 and the microlenses 70, for electrical connection.

The metal lines 30 can be separated from each other by an interlayer insulating layer 20. Metal lines 30 can be connected to each other through vias (not shown) passing through the interlayer insulating layer 20. According to embodiments, the metal lines 30 can include a copper plated layer 40 and a conductive barrier layer 50.

In an embodiment, the metal lines 30 and vias can be formed of copper.

The conductive barrier layer 50 serves as a barrier layer for copper and can be formed on the metal lines.

The conductive barrier layer 50 can inhibit contact between the metal lines 30 and the interlayer insulating layer 20 to inhibit the copper plated layer 40 from diffusing into the interlayer insulating layer 20.

Since the copper plated layer 40 of the metal line 30 can have low resistance and excellent electromigration resistance characteristics, it can deal with a high-density current. However, if the copper plated layer 40 were to contact an insulating layer, such as an oxide layer, copper atoms may diffuse between the copper plated layer 40 and the insulating layer. Therefore, to inhibit this diffusion, the conductive barrier layer 50 can be formed on the copper plated layer 40.

Figure 2:
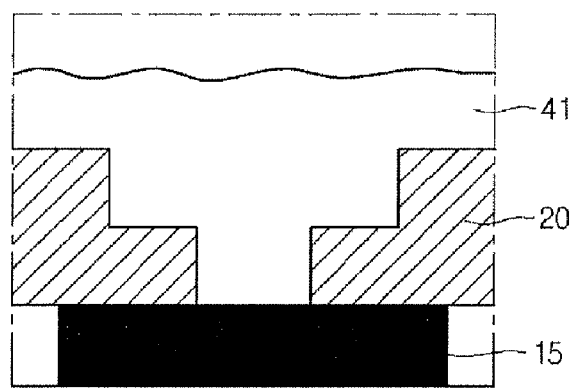
FIGS. 2 to 4 are cross-sectional views illustrating a process for forming a metal line of an image sensor according to an embodiment of the present invention.
Figure 3:
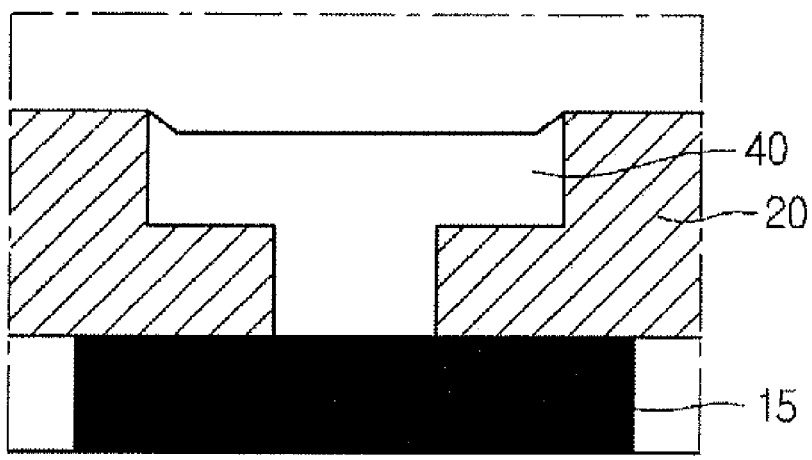
Figure 4:
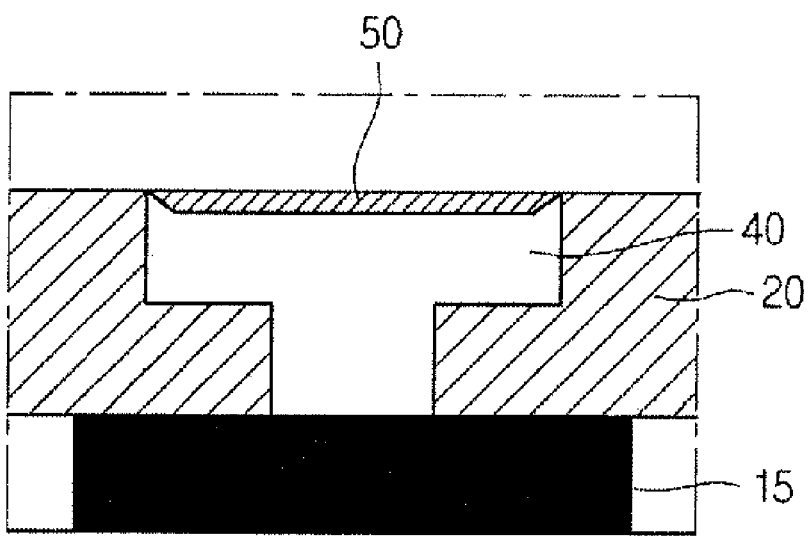

FIGS. 2 to 4 are cross-sectional views illustrating a method for forming a metal line of an image sensor according to an embodiment.

Referring to FIG. 2, an interlayer insulating layer 20 can be formed on an insulating layer including a lower line 15. Then, a trench can be formed using a single or dual damascene process.

Referring to FIG. 3, copper for forming the metal line 30 can be plated in the trench to form the copper plated layer 40. In an embodiment, a chemical mechanical polishing (CMP) process can then be performed to planarize the copper plated layer 40.

Though not shown, in an embodiment, before the copper plated layer 40 is deposited, a barrier metal layer for inhibiting copper from diffusing, and a copper seed layer can be formed in the trench.

The interlayer insulating layer 20 can be used as an etch stop layer during the CMP process on the copper plated layer 40. The copper plated layer 40 formed in the trench can be polished to a further extent than the interlayer insulating layer 20 so that a height difference can be generated between the copper plated layer 40 and the interlayer insulating layer 20 by controlling the CMP process.

Therefore, the copper plated layer 40 can be formed to have a lower height than that of the interlayer insulating layer 20.

In an embodiment, a dishing phenomenon can be generated in the copper plated layer 40. Accordingly, a short circuit or a leakage current increase between adjacent metal lines 30 can be inhibited while the conductive barrier layer 50 is deposited using electroless plating.

In many embodiments, the height difference between the copper plated layer 40 and the interlayer insulating layer 20 can be in a range of from about 10 Å to about 500 Å.

Referring to FIG. 4, a conductive barrier layer 50 can be formed on the copper plated layer 40. For example, the conductive barrier layer 50 can be formed to have a thickness of from about 10 Å to about 1000 Å. The conductive barrier layer 50 can be formed using, for example, a cobalt or nickel alloy through an electroless plating process.

The conductive barrier layer 50 can be selectively formed on only the copper plated layer 40 through an electroless plating process.

Accordingly, the conductive barrier layer 50 is not formed on the interlayer insulating layer 20, so light is not reflected or refracted. This leads to enhanced light transmittance at the photodiode region.

FIGS. 5 to 8 are cross-sectional views illustrating a process for forming a copper bump on a metal pad of an image sensor according to an embodiment.

Figure 5:
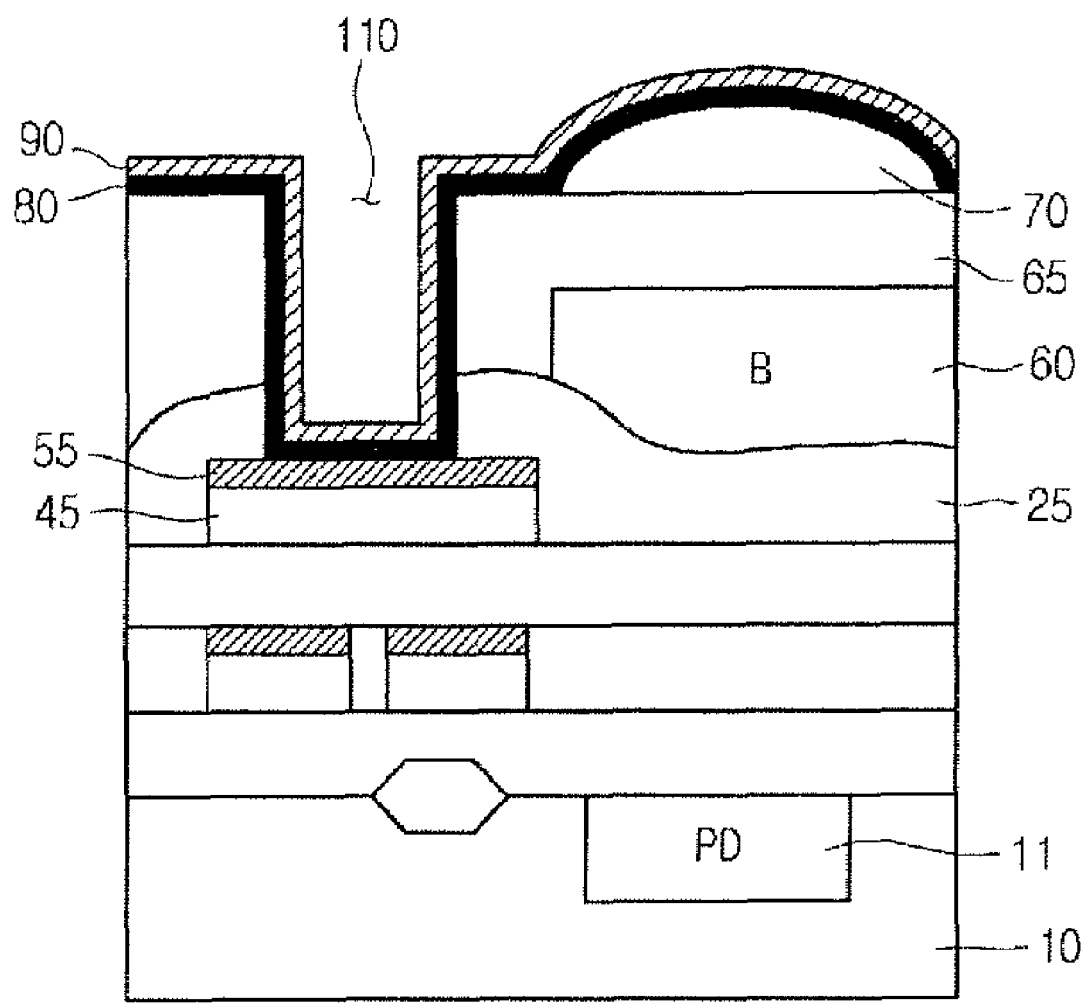
FIGS. 5 to 8 are cross-sectional views illustrating a process for forming a copper bump of an image sensor according to an embodiment of the present invention.

Referring to FIG. 5, a photolithography process can be performed on the substrate 10 where a microlens 70 has been formed. The photolithography process can be performed to etch portions of an over coating layer 65 and an interlayer insulating layer 25 that correspond to a metal pad region.

Then, a pad opening 110 over a metal pad 45 can be formed.

Since a conductive barrier layer 55 can be formed on the copper plated layer of the metal pad 45, the surface of the conductive barrier layer 55 can be exposed when the pad opening 110 is formed.

To prevent copper deposited in the pad opening 110 from diffusing, a barrier metal layer 80 and a copper seed layer 90 can be formed on a semiconductor substrate 10 including the pad opening 110 and the microlens 70.

For example, the barrier metal layer 80 can be formed of Ta, TaN, TaSiN, TiSiN, or some combination thereof. The metal barrier layer 80 can be formed using, for example, physical vapor deposition (PVD), chemical vapor deposition (CVD), or atomic layer deposition (ALD).

In an embodiment, the copper seed layer 90 can be formed to have a thickness of from about 10 Å to about 50,000 Å. The copper seed layer 90 can be formed by depositing copper using PVD, CVD, or ALD.

Figure 6:
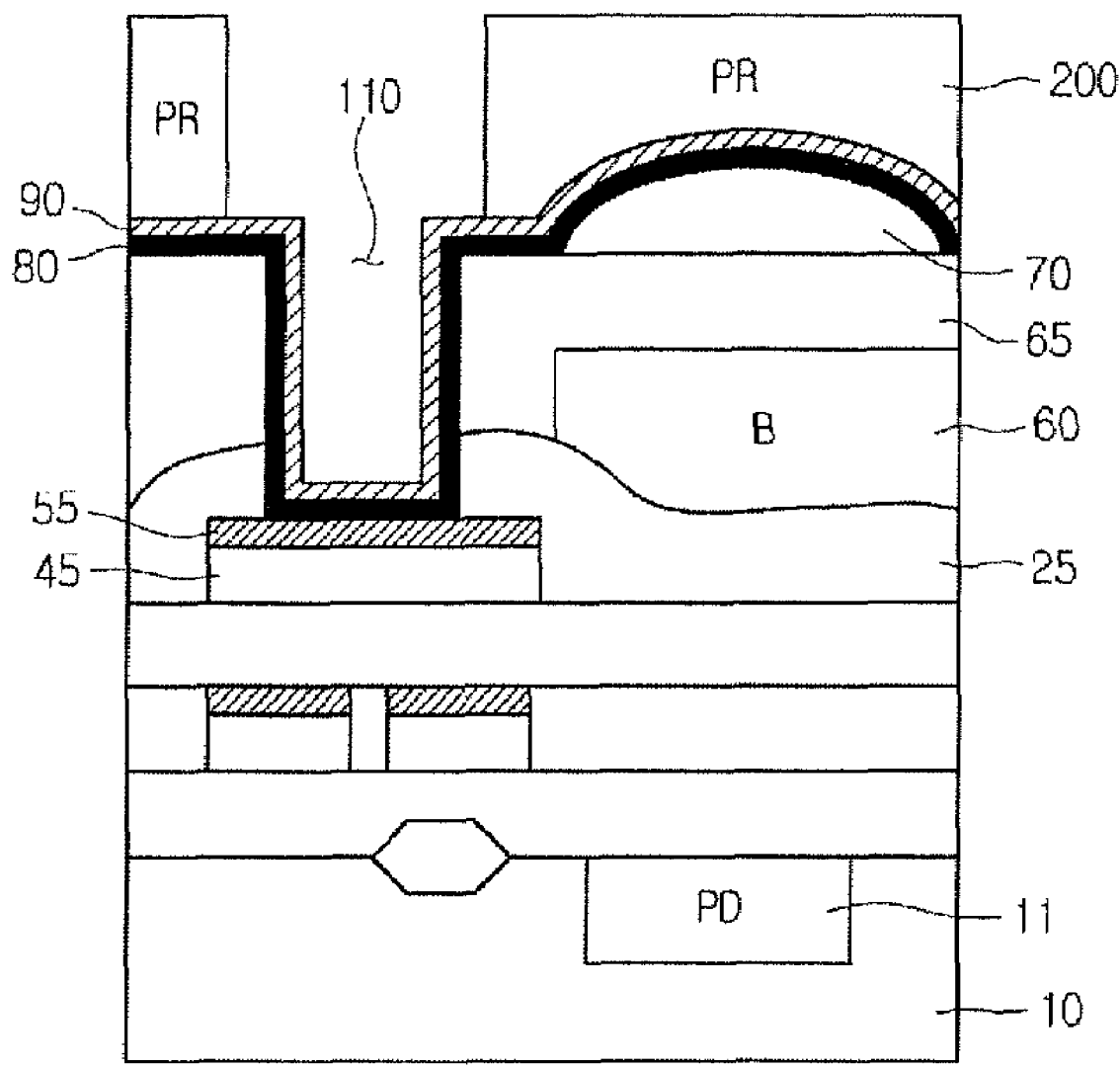

Referring to FIG. 6, a photoresist layer can be coated on the copper seed layer 90. Then, photoresist patterns 200 exposing the pad opening 110 can be formed. In an embodiment, the opening in the photoresist patterns 200 can be formed to be wider than the pad opening 110.

Figure 7:
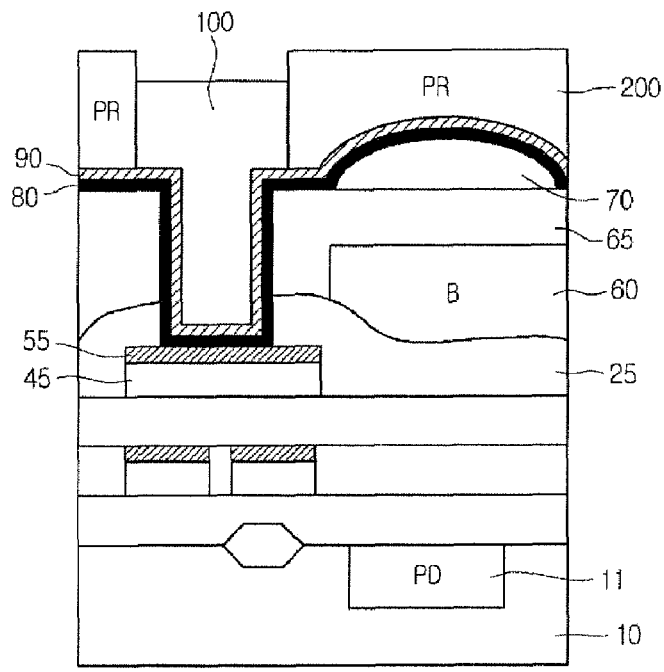

Referring to FIG. 7, a copper plated layer can be formed to gap-fill the pad opening 110 on the semiconductor substrate 10 including the photoresist patterns 200. For example, the copper plated layer can be formed using electro-plating.

A planarization process can be performed on the copper plated layer to form a copper bump 100. In an embodiment, the copper bump 100 can have a height of from about 0.5 μm to about 500 μm.

Figure 8:
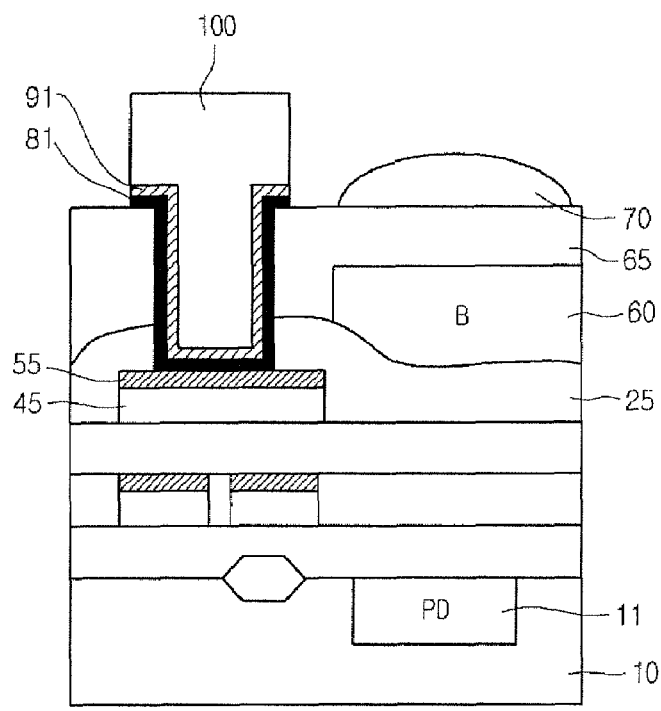

Referring to FIG. 8, the photoresist patterns 200 can be removed, and the copper seed layer 90 and the barrier metal layer 80 can be etched using the copper bump 100 as an etch mask. Accordingly, the barrier metal layer 81, the copper seed layer 91, and the copper bump 100 can be formed on the metal pad 45.

Many embodiments of the present invention use a copper plated layer to reduce the thickness between the metal line and an insulating layer of an image sensor.

Also, according to an embodiment, light efficiency at light-receiving regions is maximized since a copper barrier metal, used as a conductive barrier layer, is selectively formed on only a copper plated layer to separate a metal layer from an interlayer insulating layer.

In addition, the electromigration characteristics of an image sensor according to an embodiment of the present invention are improved since the conductive barrier layer is formed on only the copper plated layer of the metal line, thus preventing copper from diffusing into the interlayer insulating layer.

Moreover, in embodiments that use CMP control during deposition of the copper plated layer of the metal line, selective deposition efficiency on the copper plated layer can be increased. The height of the copper plated layer can be controlled to be lower than the height of the interlayer insulating layer.

Furthermore, manufacturing costs can be reduced since the copper bump can be formed on the conductive barrier layer of the metal pad without the need for the typical aluminum pad.

Forming the copper bump on the conductive barrier layer of the metal pad also reduces manufacturing costs since a typical gold bump does not need to be formed.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor, comprising:
   forming an interlayer insulating layer on a substrate including a photodiode;
   forming a metal line and a metal pad in the interlayer insulating layer;
   forming a color filter layer and microlenses on the interlayer insulating layer including the metal line;
   selectively etching the interlayer insulating layer to form a pad opening exposing the metal pad; and
   depositing copper in the pad opening to form a copper bump,
   wherein depositing copper in the pad opening to form a copper bump comprises:
   forming a barrier metal layer and a copper seed layer on the substrate over the pad opening and the microlens;
   forming a photoresist pattern on the copper seed layer, the photoresist pattern exposing the pad opening;
   forming a copper plated layer in the pad opening;
   planarizing the copper plated layer; and
   removing the photoresist patterns.

2. The method according to claim 1, wherein the metal line comprises a copper plated layer and a conductive barrier layer.

3. The method according to claim 2, wherein the conductive barrier layer comprises an alloy selected from the group consisting of a cobalt alloy and a nickel alloy.

4. The method according to claim 1, wherein the barrier metal layer comprises at least one constituent selected from the group consisting of Ta, TaN, TaSiN, and TiSiN.

5. The method according to claim 1, wherein the copper seed layer has a thickness of from about 10 Å to about 50,000 Å.

6. The method according to claim 1, wherein the copper bump has a height of from about 0.5 μm to about 500 μm.

* * * * *